(12) United States Patent
Makifuchi et al.

(10) Patent No.: US 9,960,040 B2
(45) Date of Patent: May 1, 2018

(54) MANUFACTURING METHOD OF SILICON CARBIDE SEMICONDUCTOR DEVICE

(71) Applicant: FUJI ELECTRIC CO., LTD., Kawasaki-shi, Kanagawa (JP)

(72) Inventors: Youichi Makifuchi, Kawasaki (JP); Mitsuo Okamoto, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 14/960,285

(22) Filed: Dec. 4, 2015

(65) Prior Publication Data

US 2016/0093494 A1    Mar. 31, 2016

Related U.S. Application Data

(63) Continuation of application No. PCT/JP2014/066053, filed on Jun. 17, 2014.

(30) Foreign Application Priority Data

Jun. 21, 2013 (JP) ................................ 2013-131081

(51) Int. Cl.
  *H01L 21/04*    (2006.01)
  *H01L 29/78*    (2006.01)
  (Continued)

(52) U.S. Cl.
  CPC .......... *H01L 21/049* (2013.01); *H01L 21/044* (2013.01); *H01L 29/045* (2013.01);
  (Continued)

(58) Field of Classification Search
  CPC ............... H01L 21/049; H01L 29/1095; H01L 29/0878; H01L 29/7802; H01L 29/66068;
  (Continued)

(56) References Cited

U.S. PATENT DOCUMENTS

2004/0087093 A1* 5/2004 Fukuda ................. H01L 21/049
    438/301
2006/0211187 A1* 9/2006 Choi ................. H01L 21/28123
    438/197

(Continued)

FOREIGN PATENT DOCUMENTS

JP    H09-199497 A    7/1997
JP    2006-196713 A    7/2006

(Continued)

*Primary Examiner* — Fernando L Toledo
*Assistant Examiner* — Adam S Bowen
(74) *Attorney, Agent, or Firm* — Rabin & Berdo, P.C.

(57) ABSTRACT

In producing a MOS silicon carbide semiconductor device, after a first heat treatment (oxynitride) is performed in an oxidation atmosphere including nitrous oxide or nitric oxide, a second heat treatment including hydrogen is performed, whereby in the front surface of a SiC epitaxial substrate, a gate insulating film is formed. A gate electrode is formed and after an interlayer insulating film is formed, a third heat treatment is performed to bake the interlayer insulating film. After contact metal formation, a fourth heat treatment is performed to form a reactive layer of contact metal and the silicon carbide semiconductor. The third and fourth heat treatments are performed in an inert gas atmosphere of nitrogen, helium, argon, etc., and a manufacturing method of a silicon carbide semiconductor device is provided achieving a normally OFF characteristic and lowered interface state density.

7 Claims, 6 Drawing Sheets

(51) Int. Cl.
*H01L 29/66* (2006.01)
*H01L 29/04* (2006.01)
*H01L 29/16* (2006.01)
*H01L 29/08* (2006.01)
*H01L 29/10* (2006.01)

(52) U.S. Cl.
CPC ...... *H01L 29/0878* (2013.01); *H01L 29/1095* (2013.01); *H01L 29/1608* (2013.01); *H01L 29/66068* (2013.01); *H01L 29/78* (2013.01); *H01L 29/7802* (2013.01)

(58) Field of Classification Search
CPC . H01L 29/045; H01L 29/1608; H01L 21/044; H01L 29/78
USPC .......................................................... 438/590
See application file for complete search history.

(56) References Cited

U.S. PATENT DOCUMENTS

| | | | | |
|---|---|---|---|---|
| 2009/0072244 | A1* | 3/2009 | Harada | H01L 21/02126 |
| | | | | 257/77 |
| 2012/0235165 | A1* | 9/2012 | Harada | H01L 21/02378 |
| | | | | 257/77 |
| 2013/0299808 | A1* | 11/2013 | Sugimoto | H01L 27/3258 |
| | | | | 257/40 |

FOREIGN PATENT DOCUMENTS

| | | |
|---|---|---|
| JP | 2006-210818 A | 8/2006 |
| JP | 2007-242744 A | 9/2007 |
| JP | 2011-199132 A | 10/2011 |
| JP | 2013-004643 A | 1/2013 |
| JP | 2013-045789 A | 3/2013 |

* cited by examiner

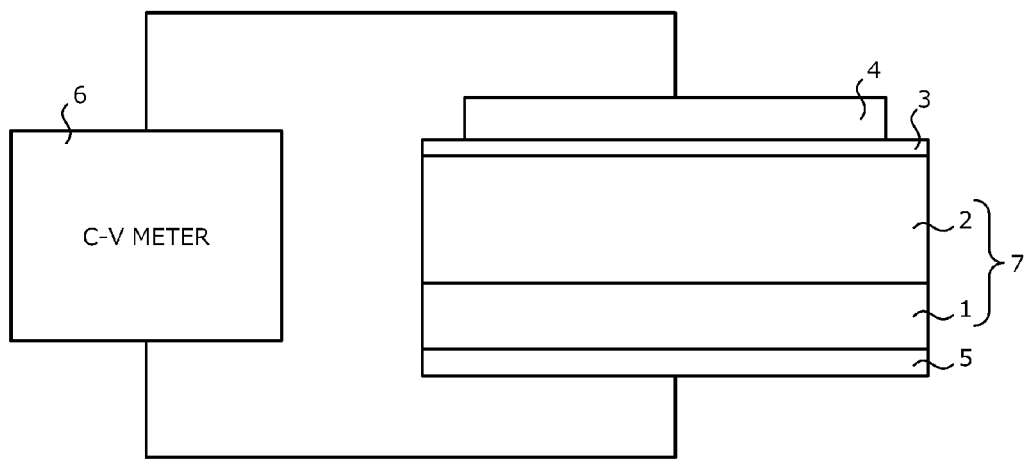
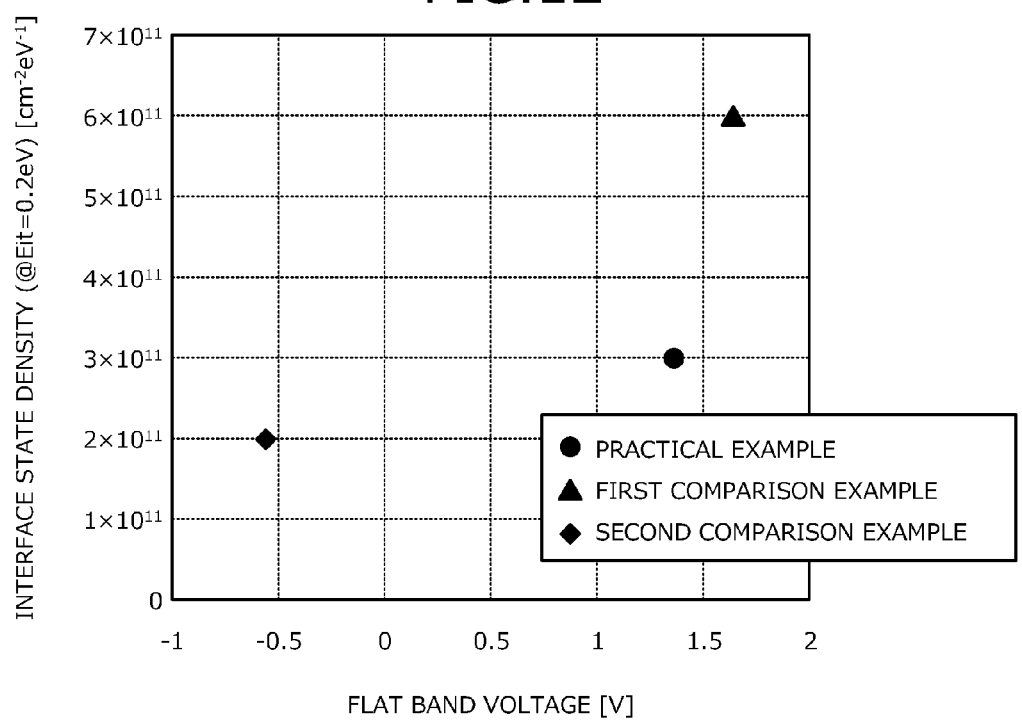

MANUFACTURING METHOD OF SILICON CARBIDE SEMICONDUCTOR DEVICE

CROSS REFERENCE TO RELATED APPLICATIONS

This is a continuation application of International Application PCT/JP2014/066053 filed on Jun. 17, 2014 which claims priority from a Japanese Patent Application No. 2013-131081 filed on Jun. 21, 2013, the contents of which are incorporated herein by reference.

BACKGROUND OF THE INVENTION

1. Field of the Invention

The present invention relates to a manufacturing method of a silicon carbide semiconductor device.

2. Description of the Related Art

Research and development of next generation semiconductor devices that use a semiconductor substrate (silicon carbide substrate) employing silicon carbide (SiC) as a semiconductor material is advancing. Similar to silicone (Si), silicon carbide can form a gate insulating film by thermal oxidation. However, silicon carbide has a characteristic in that differences in channel mobility near the junction interface (hereinafter, MOS gate interface) of the silicon carbide substrate and the gate insulating film forming the metal oxide semiconductor (MOS) gate occur depending on the surface orientation of a principal surface of the substrate, the thermal oxidation method, etc. Interface state density is used as an index to alternatively evaluate channel mobility. In general, it is known that the smaller the interface state density is at the MOS gate interface, the greater the channel mobility tends to be.

As a method of forming a gate insulating film on a silicon carbide substrate, a method of performing thermal oxidation using an atmosphere that includes nitrogen such as nitrous oxide ($N_2O$), nitric oxide (NO), etc. is known. Under this method, oxidation and nitriding simultaneously occur and nitrogen atoms in the atmosphere contribute to termination of dangling bonds of silicon atoms of the MOS gate interface and in the gate insulating film, thereby achieving a lower interface state density at the MOS gate interface. Further, immediately after this oxidation, annealing (heat treatment) in an atmosphere that includes hydrogen ($H_2$) is performed and dangling bonds of the silicon atoms remaining after oxidation are terminated by hydrogen atoms, whereby the interface state density at the MOS gate interface is further decreased.

In the manufacturing process of a semiconductor device that uses a silicon carbide substrate, a process of heat treatment is essential after the formation of the gate insulating film, such as heat treatment for lowered resistivity and formation a gate electrode, heat treatment for baking and the formation of an interlayer insulating film, and heat treatment for the formation of a reactive layer (electrical contact unit) of a silicon carbide semiconductor (silicon carbide substrate) and a contact metal, and the formation of the contact metal. In the formation process of the gate insulating film, interface characteristics such as the interface state density at the junction interface of the silicon carbide substrate and the gate oxide film are set such that given conditions are satisfied, however, the interface characteristics are known to change consequent to heat treatment after the formation of the gate insulating film (for example, refer to Japanese Laid-Open Patent Publication No. 2007-242744).

Japanese Laid-Open Patent Publication No. 2007-242744 proposes a method in which in the manufacture of a metal-oxide-semiconductor field-effect transistor (MOSFET) having a MOS gate on a (000-1) surface of a silicon carbide substrate, heat treatment for forming a reactive layer of a contact metal and a silicon carbide semiconductor is performed in a mixed gas atmosphere (forming gas (FG) atmosphere) of hydrogen and an inert gas, rather than in an inert gas atmosphere, whereby increases in the interface state density at the MOS gate interface are suppressed and contact resistance is reduced.

Nonetheless, as described above, in a semiconductor device that uses a silicon carbide substrate, high-temperature heat treatment is essential after the formation of the gate insulating film and consequent to the conditions of this heat treatment (temperature, atmosphere, etc.), the characteristics of the semiconductor device change. Therefore, in addition to formation conditions of the gate insulating film, conditions of the heat treatment performed after the formation of the gate insulating film have to also be considered. For example, the semiconductor device is preferably in an OFF state (hereinafter, normally OFF) when no signal is being input to the gate. In other words, the threshold voltage of the semiconductor device is preferably a positive value.

The threshold voltage is expressed by a function having the flat band voltage as an argument and to make the threshold voltage a positive value, the flat band voltage is preferably a positive value. Nonetheless, in the described formation method of a gate insulating film, i.e., in a method of performing thermal oxidation of a (000-1) surface or a (11-20) surface of a silicon carbide substrate in a gas atmosphere that includes nitrogen such as nitrous oxide or nitric oxide and further performing annealing in an atmosphere that includes hydrogen to reduce the interface state density at the junction interface of the gate oxide film and the silicon carbide substrate, the flat band voltage becomes a negative value and when no signal is being input to the gate, the semiconductor device is in an ON state (normally ON).

SUMMARY OF THE INVENTION

It is an object of the present invention to at least solve the above problems in the conventional technologies.

A manufacturing method of a silicon carbide semiconductor device according to one aspect of the present invention includes forming a gate insulating film on a surface of a semiconductor substrate of silicon carbide, the surface being tilted within a range of 0 degrees or greater and 8 degrees or less from any one among a (000-1) surface and a (11-20) surface, the gate insulating film being formed by performing on the semiconductor substrate, a second heat treatment in an atmosphere that includes hydrogen, after a first heat treatment is performed in an oxidation atmosphere obtained from an oxidized compound that includes nitrogen; and performing in an inert gas atmosphere, a third heat treatment that is performed after the forming of the gate insulating film.

According to another aspect of the manufacturing method, a temperature of the third heat treatment is less than or equal to a temperature of the first heat treatment.

According to a further aspect of the manufacturing method, the first heat treatment is performed in an atmosphere that includes any one among nitrous oxide and nitric oxide.

According to yet another aspect of the manufacturing method, the forming of the gate insulating film includes oxidizing in a dry oxygen atmosphere before the first heat treatment, the surface of the semiconductor substrate, on which the gate insulating film is to be formed.

According to still another aspect of the manufacturing method, the forming of the gate insulating film includes depositing before the first heat treatment, an insulating film that configures the gate insulating film and has a thickness that is thinner than a thickness of the gate insulating film.

According to another aspect of the manufacturing method, the inert gas atmosphere is an atmosphere that includes any one among nitrogen, helium, and argon.

According to yet another aspect of the manufacturing method, the third heat treatment is performed in any one among a first process for forming an electrical contact unit of the semiconductor substrate and a contact metal that abuts the semiconductor substrate, a second process for lowering resistivity of a gate electrode formed on the gate insulating film, and a third process for baking an interlayer insulating film that electrically insulates the metal film and the gate electrode.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 11 is a cross sectional view of a configuration of a MOS capacitor manufactured by the manufacturing method of a silicon carbide semiconductor device according to a practical example;

FIG. 12 is a graph depicting relations of interface state density at a MOS gate interface and flat band voltage of the MOS gate.

DETAILED DESCRIPTION OF THE PREFERRED EMBODIMENTS

Figure 1:
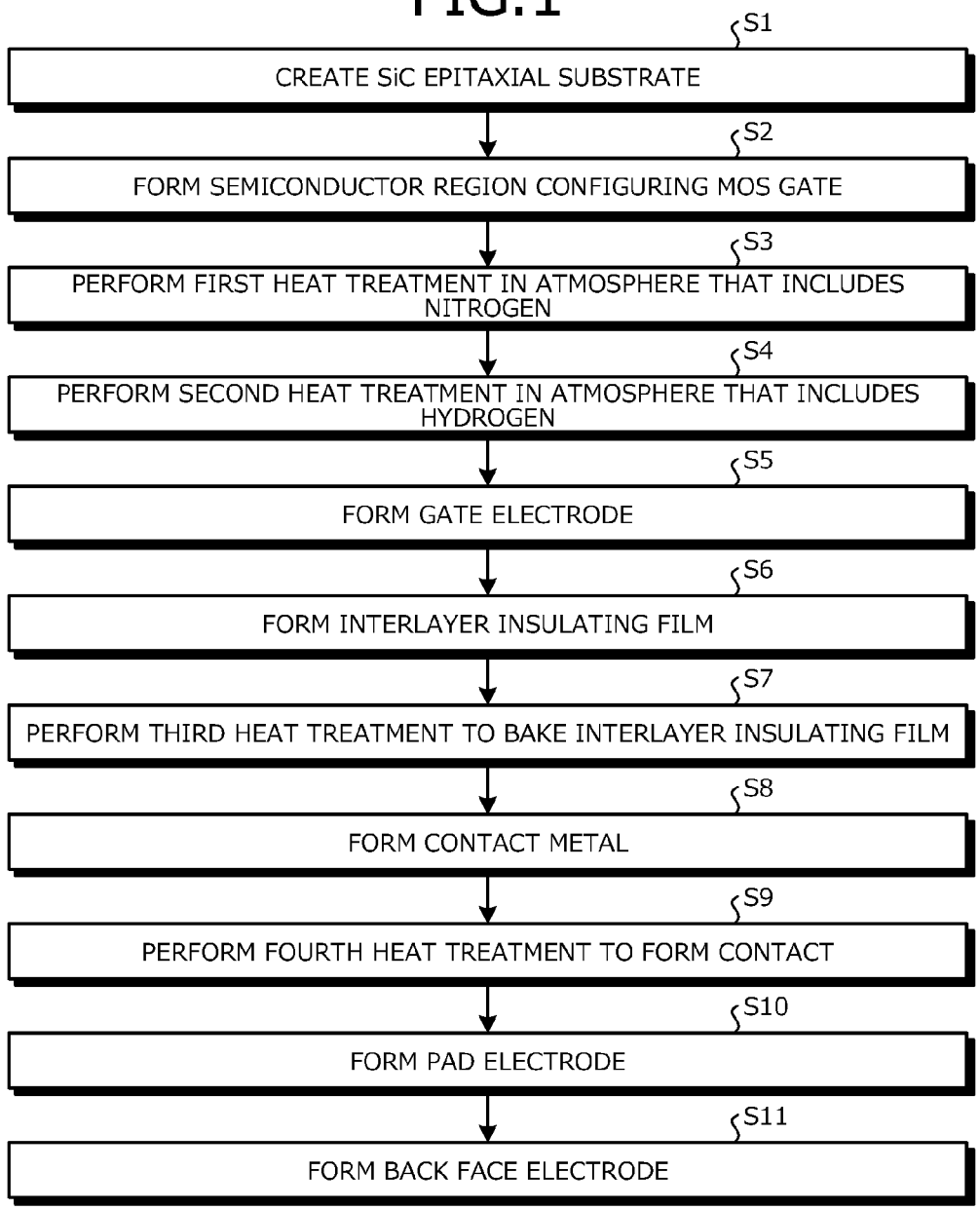
FIG. 1 is a flowchart depicting an overview of a manufacturing method of a semiconductor device according to a first embodiment.

Preferred embodiments of a manufacturing method of a silicon carbide semiconductor device according to the present invention will be described in detail with reference to the accompanying drawings. In the present specification and the accompanying drawings, layers and regions prefixed with n or p mean that majority carriers are electrons or holes. Additionally, + or − appended to n or p means that the impurity concentration is higher or lower, respectively, than layers and regions without + or −. In the present specification, when Miller indices are described, "−" means a bar added to an index immediately after the "−", and a negative index is expressed by prefixing "−" to the index. In the description of the embodiments below and the accompanying drawings, identical constituent elements will be given the same reference numerals and will not repeatedly be described.

A method of manufacturing a horizontal silicon carbide MOSFET will be described in detail as the manufacturing method of a silicon carbide semiconductor device according to a first embodiment. FIG. 1 is a flowchart depicting an overview of the manufacturing method of a semiconductor device according to the first embodiment. FIGS. 2, 3, 4, 5, 6, 7, 8, 9, and 10 are cross sectional views depicting states during the manufacturing of the silicon carbide semiconductor device according to the first embodiment. A $p^+$-type semiconductor substrate ($p^+$-type silicon carbide substrate) 11 that uses silicon carbide (SiC) as a semiconductor material is prepared. As the $p^+$-type silicon carbide substrate 11, for example, a p-type 4H—SiC substrate having a principal surface that is a surface tilted about 0 to 8 degrees from a 4H—SiC (000-1) surface (preferably, a surface tilted about 0 to 4 degrees) may be prepared.

Figure 2:
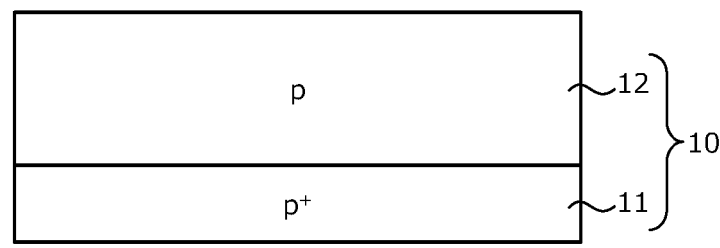
FIGS. 2, 3, 4, 5, 6, 7, 8, 9, and 10 are cross sectional views depicting states during the manufacturing of a silicon carbide semiconductor device according to the first embodiment.

Subsequently, in a front surface of the $p^+$-type silicon carbide substrate 11, for example, a p-type epitaxial layer 12 of a thickness on the order of 5 μm or more and 10 μm or less is grown. The acceptor density of the p-type epitaxial layer 12 may be, for example, $1\times10^{16}$ cm$^{-3}$. Consequently, a p-type SiC epitaxial substrate 10 formed by stacking the p-type epitaxial layer 12 on the $p^+$-type silicon carbide substrate 11 is created (step S1). The state up to this point is depicted in FIG. 2. Hereinafter, the surface that is on the p-type epitaxial layer 12 side of the SiC epitaxial substrate 10 will be regarded as the front surface and the surface that is on the $p^+$-type silicon carbide substrate 11 side of the SiC epitaxial substrate 10 (i.e., the back surface of the $p^+$-type silicon carbide substrate 11) will be regarded as the back surface.

Subsequently, in a surface layer of the front surface of the SiC epitaxial substrate 10 (i.e., the opposite side of the p-type epitaxial layer 12 with respect to the $p^+$-type silicon carbide substrate 11 side of the p-type epitaxial layer 12), a semiconductor region configuring a MOS gate (an insulated gate formed from a metal-oxide-semiconductor) is formed (step S2). More specifically, for example, an oxide film (SiO$_2$ film) 31 of a thickness of, for example, 1 μm is deposited on the front surface of the SiC epitaxial substrate 10 by a low-pressure chemical vapor deposition (CVD) method. Subsequently, the oxide film 31 is patterned by photolithography and portions of the oxide film 31, respectively corresponding to a formation region of an n$^+$ drain region and a formation region of an n$^+$ source region, are removed.

Figure 3:
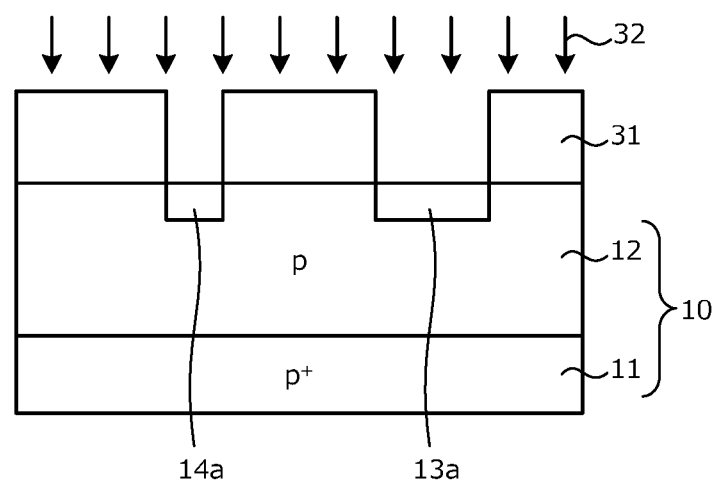

Subsequently, the remaining portion of the oxide film 31 is used as a mask and phosphorus (P) ions 32 are implanted in the front surface of the SiC epitaxial substrate 10. Ion implantation conditions of the phosphorus ions 32 may be, for example, a substrate temperature of about 500 degrees C., multistage ion implantation with acceleration energy of about 40 keV to 250 keV, and an implantation volume of about $2\times10^{20}$ cm$^{-3}$. Consequently, in the surface layer of the front surface of the SiC epitaxial substrate 10, n-type impurity regions 13a, 14a are formed away from one another. The state up to this point is depicted in FIG. 3.

Subsequently, after the remaining portion of the oxide film 31 is removed, for example, an oxide film 33 of a thickness of 1 μm is deposited by a low-pressure CVD method. Thereafter, the oxide film 33 is patterned by photolithography and a portion of the oxide film 33, corresponding to a formation region of a p$^+$ ground region, is removed. Subsequently, the remaining portion of the oxide film 33 is used as a mask and aluminum (Al) ions 34 are implanted in the front surface of the SiC epitaxial substrate 10.

Figure 4:
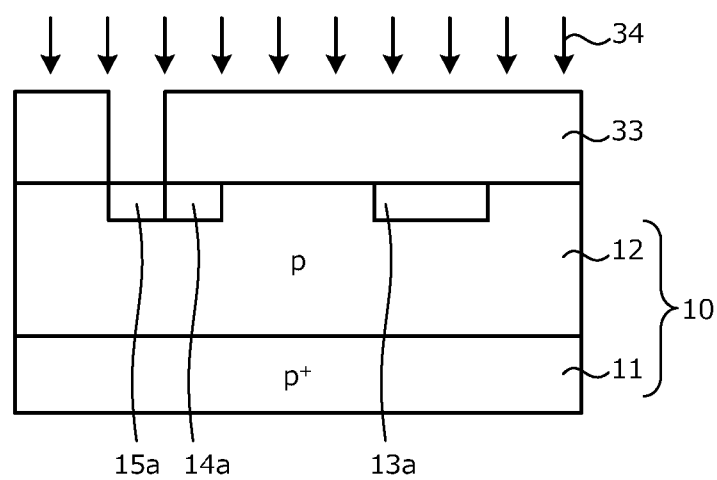

Ion implantation conditions of the aluminum ions 34 may be, for example, a substrate temperature of about 500 degrees C., multistage ion implantation with acceleration energy within a range of about 40 keV to 200 keV, and an implantation volume of about $2\times10^{20}$ cm$^{-3}$. Consequently, in a surface layer of the front surface of the SiC epitaxial substrate 10, a p-type impurity region 15a is formed to abut the impurity region 14a, on the opposite side of the impurity region 14a with respect to the impurity region 13a side of the impurity region 14a. The state up to this point is depicted in FIG. 4.

Figure 5:
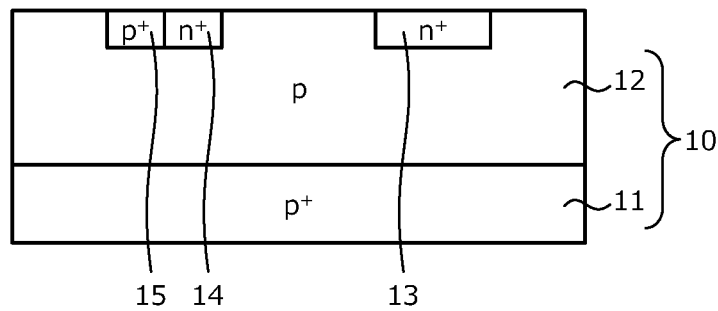

Subsequently, after the remaining portion of the oxide film 33 is removed, for example, annealing is performed in an argon atmosphere for 5 minutes at a temperature of 1600 degrees C. and the impurity regions 13a, 14a, 15a are activated. As a result, in active regions (the activated regions), an drain region 13 formed by activation of the impurity region 13a, an n$^+$ source region 14 formed by activation of the impurity region 14a, and a p$^+$ ground region 15 formed by activation of the impurity region 15a are formed. An active region is a region in which current flows during the ON state. The state up to this point is depicted in FIG. 5.

Figure 6:
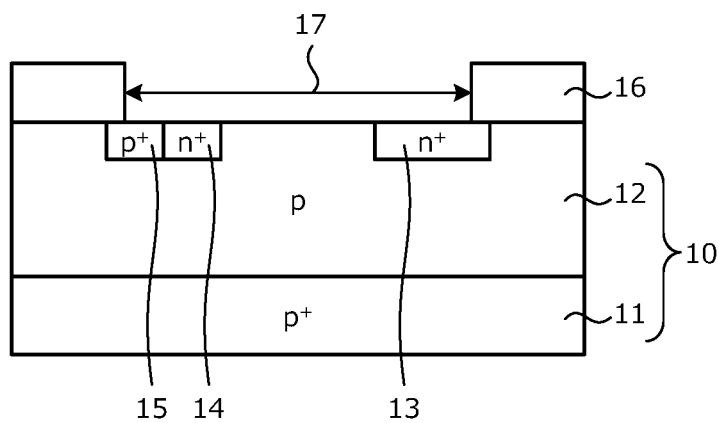
Figure 7:
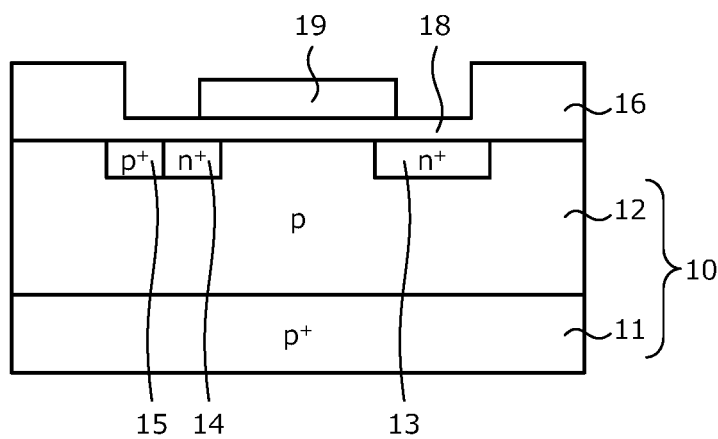

Subsequently, a field oxide film 16 of a thickness of, for example, 0.5 μm is deposited in the front surface of the SiC epitaxial substrate 10, for example, by a low-pressure CVD method. Subsequently, the field oxide film 16 is selectively removed by photolithography and the front surface of the SiC epitaxial substrate 10 in an active region 17 is exposed. Removal of the field oxide film 16 may be performed by, for example, wet etching. As a result, in the active region 17, the n$^+$ drain region 13, the n$^+$ source region 14, and the p$^+$ ground region 15 are exposed. The state up to this point is depicted in FIG. 6.

After the SiC epitaxial substrate 10 is washed, for example, in an oxidation atmosphere that includes nitrogen, a first heat treatment (oxynitride) is performed (step S3). More specifically, for example, the first heat treatment is performed at a temperature of about 1300 degrees C. for about 100 minutes in an atmosphere in which the flow ratio of nitrous oxide (N$_2$O) to nitrogen is 1:5. Subsequently, a second heat treatment is performed, for example, at a temperature of about 1000 degrees C. for about 30 minutes in an atmosphere that includes hydrogen (H$_2$) (step S4). On the front surface of the SiC epitaxial substrate 10 in the active region 17, a gate insulating film 18 of a thickness of about 50 nm, for example, is formed by the first and second heat treatments. The atmosphere of the second heat treatment may be a mixed gas atmosphere in which the hydrogen is diluted by an inert gas.

Subsequently, a gate electrode 19 is formed on the gate insulating film 18 (step S5). More specifically, for example, polycrystalline silicon of a thickness of 0.3 μm, for example, is deposited on the gate insulating film 18 by a low-pressure CVD method. The polycrystalline silicon is patterned by photolithography and a portion of the polycrystalline silicon, covering the p-type epitaxial layer 12 from the n$^+$ drain region 13 to the n$^+$ source region 14 is left as the gate electrode 19. Subsequently, the resist film used in the patterning of the gate electrode 19 is removed. The state up to this point is depicted FIG. 7.

After the SiC epitaxial substrate 10 is cooled to room temperature (e.g., 25 degrees C.), an interlayer insulating film (not depicted) covering the front surface side of the SiC epitaxial substrate 10 is formed (step S6). Subsequently, in an inert gas atmosphere, a third heat treatment is performed at a temperature of about 800 degrees C. for about 10 minutes to bake the interlayer insulating film (step S7).

Contact metal 20 is formed to abut the semiconductor region (silicon carbide semiconductor) configuring the MOS gate (step S8). More specifically, for example, the gate insulating film 18 and the interlayer insulating film are selectively removed by photolithography to form a contact hole exposed by the n$^+$ drain region 13 and a contact hole exposed by the n$^+$ source region 14 and the p$^+$ ground region 15. The removal of the gate insulating film 18 and the interlayer insulating film, for example, may be performed by wet etching using hydrofluoric (HF) acid.

Figure 8:
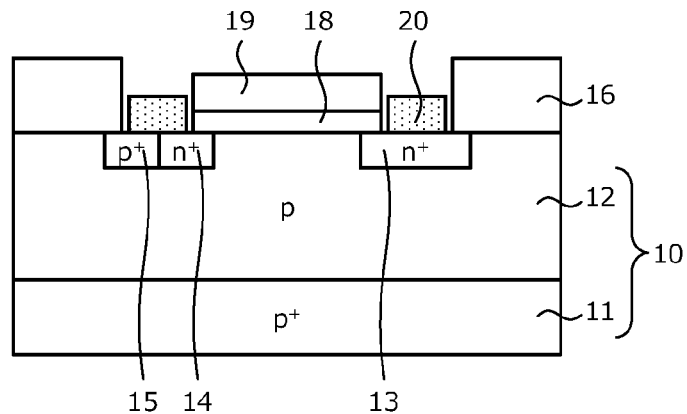

An aluminum film of, for example, a thickness of 10 nm and a nickel film of, for example, a thickness of 60 nm are sequentially vapor-deposited to fill the contact holes and form a layered metal film. The resist film used for the patterning of the gate insulating film 18 and the interlayer insulating film is lifted off and together with the resist film, the layered metal film on the resist film is removed, whereby the layered metal film in the contact holes remains as the contact metal 20 abutting the n$^+$ drain region 13 and the contact metal 20 abutting the n$^+$ source region 14 and the p$^+$ ground region 15. The state up to this point is depicted in FIG. 8.

Figure 9:
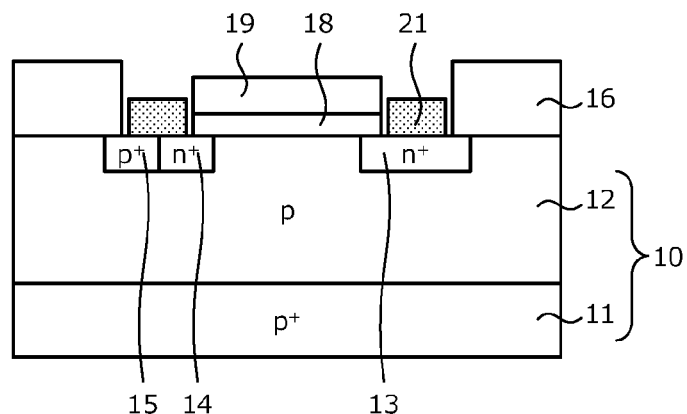
Figure 10:
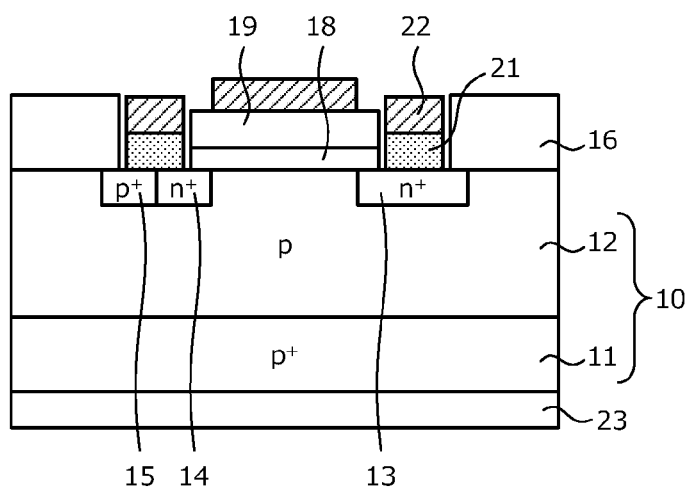

Subsequently, a fourth heat treatment is performed to form an ohmic contact of the contact metal 20 and the silicon carbide semiconductor (step S9). More specifically, for example, the fourth heat treatment is performed in an inert gas atmosphere at a temperature of 950 degrees C. for about 2 minutes to form a reactive layer (electrical contact unit: contact) 21 of the contact metal 20 and the silicon carbide semiconductor. The state up to this point is depicted in FIG. 9.

The third and fourth heat treatments described above, for example, are performed in an inert gas atmosphere such as nitrogen (N$_2$), helium (He), or argon (Ar). With consideration of the extent of baking of the interlayer insulating film, for example, there are various options for the temperature of the third heat treatment and with consideration of contact resistance, for example, there are various options for the temperature of the fourth heat treatment. However, cases where the temperature of the third and fourth heat treatments is higher than the temperature (oxidizing temperature) of the first heat treatment may invite large increases in the interface state density at the junction interface of the gate insulating film 18 and the silicon carbide semiconductor (the p-type epitaxial layer 12). Therefore, the temperature of the third and fourth heat treatments is preferably the temperature of the first heat treatment or lower.

An aluminum (Al) film of a thickness of, for example, 300 nm is vapor-deposited on the front side surface side of the SiC epitaxial substrate 10. Subsequently, the aluminum film is selectively removed by photolithography to form a pad electrode 22 on the reactive layer 21 and the gate electrode 19 (step S10). The removal of the aluminum film, for example, may be performed by wet etching using phosphoric acid (H$_3$PO$_4$). Thereafter, an aluminum film of a thickness of, for example, 100 nm is vapor-deposited in the back side (back side of the p$^+$-type silicon carbide substrate 11) of the SiC epitaxial substrate 10 to form a back side electrode 23 (step S11) and thereby, complete a silicon carbide MOSFET depicted in FIG. 10.

Characteristics of the silicon carbide MOSFET produced according to the described manufacturing method of the first embodiment and using the various conditions given as an example were evaluated. As a result, by producing the silicon carbide MOSFET by the described manufacturing method of a silicon carbide semiconductor device according to the first embodiment, channel mobility was confirmed to be about 35 cm$^2$/Vs, an effective value for obtaining a given device characteristic and, the threshold voltage was confirmed to be 4V indicating a sufficient normally OFF characteristic.

The manufacturing method of a silicon carbide semiconductor device according to a second embodiment will be described. The manufacturing method of a silicon carbide semiconductor device according to the second embodiment differs from the manufacturing method of a silicon carbide semiconductor device according to the first embodiment in the method by which the gate insulating film 18 is formed. More specifically, in the second embodiment, the gate insulating film 18 is formed as follows.

In a dry oxygen atmosphere, for example, heat treatment (oxidation) is performed at a temperature of about 1100 degrees C. for about 50 minutes. Subsequently, in an atmosphere in which the flow ratio of nitrous oxide to nitrogen is 1:20, for example, the first heat treatment (oxynitride) is performed at a temperature of about 1300 degrees C. for about 30 minutes. Subsequently, in an atmosphere that includes hydrogen, for example, heat treatment is performed at a temperature of about 1000 degrees C. for 30 about minutes. Excluding the process of forming the gate insulating film 18, the other processes of the manufacturing method of a silicon carbide semiconductor device according to the second embodiment are identical to the processes of the first embodiment.

Characteristics of the silicon carbide MOSFET produced according to the manufacturing method of the second embodiment and using the various conditions given as an example were evaluated. As a result, the silicon carbide MOSFET produced by the manufacturing method of a silicon carbide semiconductor device according to the second embodiment was confirmed to exhibit the same characteristics as the silicon carbide MOSFET produced by the manufacturing method of a silicon carbide semiconductor device according to the first embodiment.

The manufacturing method of a silicon carbide semiconductor device according to a third embodiment will be described. The manufacturing method of a silicon carbide semiconductor device according to the third embodiment differs from the manufacturing method of a silicon carbide semiconductor device according to the first embodiment in the method by which the gate insulating film 18 is formed. More specifically, in the third embodiment, the gate insulating film 18 is formed as follows.

In a dry oxygen atmosphere, for example, heat treatment (oxidation) is performed at a temperature of about 1100 degrees C. for 50 about minutes. Subsequently, in an atmosphere in which the flow ratio of nitric oxide and nitrogen is 1:10, for example, the first heat treatment (oxynitride) is performed at a temperature of about 1200 degrees C. for about 30 minutes. Subsequently, in an atmosphere that includes hydrogen, for example, the second heat treatment is performed at a temperature of about 1000 degrees C. for about 30 minutes. Excluding the process of forming the gate insulating film 18, the other processes of the manufacturing method of a silicon carbide semiconductor device according to the third embodiment are identical to the processes of the first embodiment.

Characteristics of the silicon carbide MOSFET produced according to the manufacturing method of a silicon carbide semiconductor device according to the third embodiment and using the various conditions given as an example were evaluated. As a result, the silicon carbide MOSFET produced by the manufacturing method of a silicon carbide semiconductor device according to the third embodiment was confirmed to exhibit the same characteristics as the silicon carbide MOSFET produced by the manufacturing method of a silicon carbide semiconductor device according to the first embodiment.

The manufacturing method of a silicon carbide semiconductor device according to a fourth embodiment will be described. The manufacturing method of a silicon carbide semiconductor device according to the fourth embodiment differs from the manufacturing method of a silicon carbide semiconductor device according to the first embodiment in the method by which the gate insulating film 18 is formed. More specifically, in the fourth embodiment, the gate insulating film 18 is formed as follows.

A first insulating film of a thickness (e.g., a thickness nearly 50 nm and a thickness that is less than 50 nm) that is thinner than a desired thickness of the gate insulating film 18 is formed on the front surface of the SiC epitaxial substrate 10 in the active region 17 by a deposition method. Subsequently, in an atmosphere in which the flow ratio of nitrous oxide and nitrogen is 1:20, for example, the first heat treatment (oxynitride) is performed at a temperature of about 1300 degrees C. for about 30 minutes and a second insulating film of a thickness of a few nm is formed at an interface of the first insulating film and the SiC epitaxial substrate 10. Subsequently, in an atmosphere that includes hydrogen, for example, the second heat treatment is performed at a temperature of about 1000 degrees C. for about 30 minutes. As a result, the gate insulating film 18 of a thickness of about 50 nm, which is the sum of the layered first and second insulating films, is formed. The deposition method of the first insulating film is not particularly limited and for example, the first insulating film may be deposited by a CVD method using silane ($SiH_4$) or tetraethoxysilane (TEOS). Excluding the process of forming the gate insulating film 18, the other processes of the manufacturing method of a silicon carbide semiconductor device according to the fourth embodiment are identical to the processes of the first embodiment.

Characteristics of the silicon carbide MOSFET produced according to the manufacturing method of the fourth embodiment and using the various conditions given as an example were evaluated. As a result, the silicon carbide MOSFET produced by the manufacturing method of a silicon carbide semiconductor device according to the fourth embodiment was confirmed to exhibit the same characteristics as the silicon carbide MOSFET produced by the manufacturing method of a silicon carbide semiconductor device according to the first embodiment.

Verification concerning the interface state density at the junction interface (MOS gate interface) of the gate insulating film and the silicon carbide semiconductor, and the flat band voltage of the MOS gate was performed. FIG. 11 is a cross sectional view of the configuration of a MOS capacitor manufactured by the manufacturing method of a silicon carbide semiconductor device according to a practical example. FIG. 12 is a graph depicting relations of the interface state density at the MOS gate interface and the flat band voltage of the MOS gate. As a verification specimen, the MOS capacitor (hereinafter, practical example) was produced according to the manufacturing method described in the first embodiment and using the various conditions given as an example in the first embodiment. In other words, a MOS capacitor that has the same MOS gate characteristics as the silicon carbide MOSFET according to the first embodiment and that can be produced easily without performing processes (steps S2, S6, S8, S10) for forming a complicated MOS gate structure was produced and verified.

Figure 13:
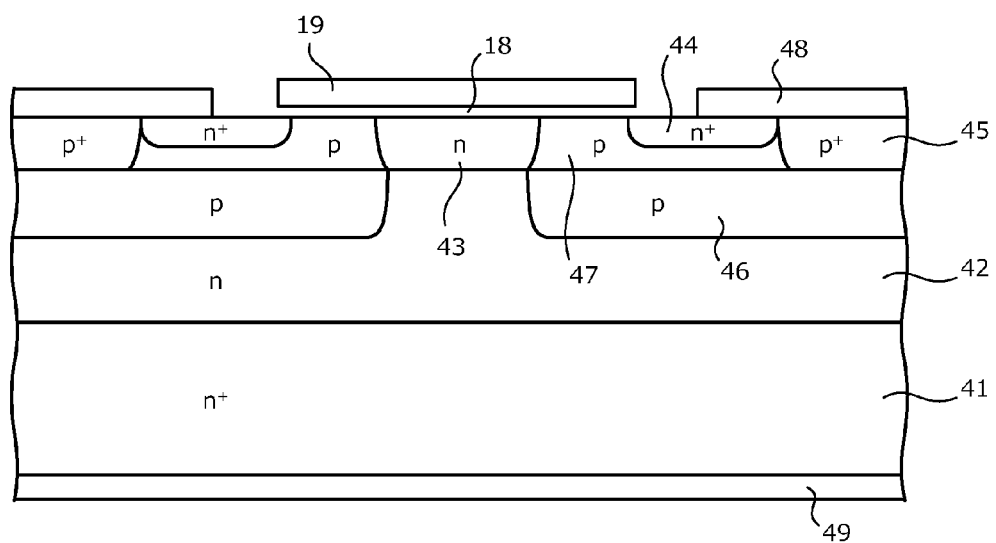
FIG. 13 is a cross sectional view of one example of a semiconductor device having a complicated MOS gate structure according to the present disclosure.

A complicated MOS gate structure, for example, is a device structure forming a channel near a surface of the SiC epitaxial substrate during the ON state. FIG. 13 depicts one example of a semiconductor device having a complicated MOS gate structure. FIG. 13 is a cross sectional view of one example of a semiconductor device having a complicated MOS gate structure according to the present disclosure. As depicted in FIG. 13, in a vertical MOSFET, an n-type epitaxial layer 42 is formed in a front surface of an $n^+$-type silicon carbide substrate 41. The impurity concentration of the n-type epitaxial layer 42 is lower than the impurity concentration of the $n^+$-type silicon carbide substrate 41. Inside the n-type epitaxial layer 42, plural p-type regions 46 are selectively formed. The p-type regions 46 are exposed in a surface of the n-type epitaxial layer 42, on the opposite side thereof with respect to the $n^+$-type silicon carbide substrate 41 side of the n-type epitaxial layer 42. Over the surface of the n-type epitaxial layer 42 and the p-type region 46, a p-type SIC layer 47 of a lower concentration than the p-type region 46 is formed. In the p-type SIC layer 47 on the n-type epitaxial layer 42 where the p-type region 46 is not formed, an n-type region 43 is formed that reaches the n-type epitaxial layer 42 and penetrates the p-type SIC layer 47 in a direction of depth. The n-type epitaxial layer 42 and the n-type region 43 are an n-type drift region. The impurity concentration of the n-type region 43 is preferably higher than the impurity concentration of the n-type epitaxial layer 42.

In the p-type SIC layer 47, an $n^+$ source region 44 and a $p^+$-type contact region 45 are formed to abut each other. The $n^+$ source region 44 and the $p^+$-type contact region 45 are exposed in a surface of the p-type SIC layer 47, on the opposite side thereof with respect to the p-type region 46 side of the p-type SIC layer 47. The $n^+$ source region 44 is formed away from the n-type region 43. The $p^+$-type contact region 45 is positioned on the opposite side of the $n^+$ source region 44 with respect to the n-type region 43 side of the $n^+$ source region 44. The impurity concentration of the $p^+$-type contact region 45 is higher than the impurity concentration of the p-type SIC layer 47. Portions of the p-type SIC layer 47 excluding the $n^+$ source region 44, the $p^+$-type contact region 45, and the n-type region 43 form a p-type base region together with the p-type region 46. A source electrode 48 is formed in the surface of the $n^+$ source region 44 and the $p^+$-type contact region 45. The gate electrode 19 is formed in the surfaces of the p-type SIC layer 47 and the n-type region 43 between adjacent $n^+$ source regions 44, via the gate insulating film 18. The gate electrode 19 is electrically insulated from the source electrode 48 by a non-depicted interlayer insulating film. Further, in the back surface of the $n^+$-type silicon carbide substrate 41, a drain electrode 49 is formed that abuts the $n^+$-type silicon carbide substrate 41.

The MOS capacitor produced as the practical example, more specifically, was produced as follows. A SiC epitaxial substrate 7 formed by stacking an n-type epitaxial layer 2 on an $n^+$-type silicon carbide substrate 1 was used (step S1). Subsequently, after performing the first heat treatment in a nitrous oxide ($N_2O$) atmosphere at a temperature of 1300 degrees C. for 100 minutes to form a gate insulating film 3 in the front surface of the SiC epitaxial substrate 7 (step S3), the second heat treatment was performed in a hydrogen ($H_2$) atmosphere at a temperature of 1000 degrees C. for 30 minutes (step S4). Subsequently, heat treatment by a nitrogen ($N_2$) atmosphere assumed for the third heat treatment for baking the interlayer insulating film and the fourth heat treatment for contact formation was performed (steps S7, S9). Subsequently, a gate electrode 4 having a dot-like planar shape is formed (step S5). Thereafter, a back side electrode 5 is formed in the entire back surface of the SiC epitaxial substrate 7 (step S11), whereby the MOS capacitor depicted in FIG. 11 is produced.

For comparison, a MOS capacitor (hereinafter, first comparison example) was produced without performing the second heat treatment (step S4) and a MOS capacitor (hereinafter, second comparison example) was produced using a mixed gas atmosphere (FG atmosphere) of an inert gas (nitrogen) and hydrogen for the atmosphere of the third and fourth heat treatments (step S7, S9). In other words, in the first comparison example, the first heat treatment in a nitrous oxide atmosphere and the third and fourth heat treatments in a nitrogen atmosphere were sequentially performed. In the second comparison example, the first heat treatment in a nitrous oxide atmosphere, the second heat treatment in a hydrogen atmosphere, and the third and fourth heat treatments in an FG atmosphere were sequentially performed. Aspects excluding the heat treatment conditions of the first and second comparison examples were the same as those of the practical example.

Concerning the MOS capacitors of the practical example and the first and second comparison examples, respectively, a capacitance-voltage (C-V) meter 6 was connected between the gate electrode 4 and the back side electrode 5, and based on measurement results of the C-V meter 6, the interface state density at the MOS gate interface and the flat band voltage of the MOS gate were calculated. The results are depicted in FIG. 12.

As depicted in FIG. 12, in comparing cases with and without the second heat treatment (hydrogen atmosphere processing), it was confirmed that the first comparison example (▲mark) in which the second heat treatment was not performed had a large interface state density at the MOS gate interface as compared to the practical example (● mark) in which the second heat treatment was performed. Further, in comparing cases differing in the type of gas used in the atmosphere for the third and fourth heat treatments, the flat band voltage of the MOS gate became a positive value in the practical example (● mark) in which the third and fourth heat treatments were performed in an inert gas atmosphere. In contrast, it was confirmed that in the second comparison example (♦ mark) in which the third and fourth heat treatments were performed in an FG atmosphere of an inert gas and hydrogen mixture, the flat band voltage of the MOS gate became a negative value.

Thus, it was confirmed that the interface state density at the MOS gate interface and the flat band voltage of the MOS gate change depending on the type of gas used in the atmosphere for the third and fourth heat treatments and whether the second heat treatment is performed. Furthermore, the practical example was confirmed to be able to reduce the interface state density at the MOS gate interface and the flat band voltage of the MOS gate to a greater extent than the first and second comparison examples. In other words, as described in each of the embodiments of the manufacturing method of a semiconductor device, it was confirmed that by performing the second heat treatment in an atmosphere that includes hydrogen when forming the gate insulating film; properly selecting the atmosphere for the third and fourth heat treatments performed after formation of the gate insulating film; and properly combining these heat treatments, the interface state density at the MOS gate interface and the flat band voltage of the MOS gate can be controlled.

As described, according to the embodiments, in forming the gate oxide film in a principal surface (i.e., a surface that is tilted about 0 to 8 degrees from a (000-1) surface) of a silicon carbide semiconductor, by performing the first heat treatment in an atmosphere that includes nitrogen, nitriding occurs simultaneously with oxidation, the nitrogen atoms in the atmosphere contribute to termination of dangling bonds of silicon atoms of the MOS gate interface and in the gate insulating film, and the interface state density at the MOS gate interface can be reduced. Further, after the first heat treatment, by performing the second heat treatment in an atmosphere that includes hydrogen, the dangling bonds of the silicon atoms that remain after oxidation are terminated by hydrogen atoms, enabling the interface state density of the MOS gate interface to be reduced further. As a result, a low interface state density of $4 \times 10^{11}$ $cm^{-2}$ $eV^{-1}$ or lower is obtained and effective channel mobility can be achieved. By using an inert gas atmosphere for the atmosphere of the heat treatment (third and fourth heat treatments) that is indispensable in the processing after the formation of the gate insulating film, a positive flat band voltage of 1V or more can be obtained and a normally OFF characteristic can be achieved. Therefore, a silicon carbide semiconductor device having effective channel mobility and a normally OFF characteristic can be provided without newly adding any particular process.

The invention is not limited to the embodiments described and various modifications are possible without departing from the scope of the invention. For example, in the described embodiments, although the fourth heat treatment for forming the ohmic contact and generally requiring the highest temperature among the heat treatments in processes performed after formation of the gate insulating film is described as an example, in cases where other heat treatment performed after the formation of the gate insulating film is performed in an inert gas atmosphere, the same effect can be achieved. More specifically, other heat treatment performed after the formation of the gate insulating film includes various types of heat treatment such as heat treatment for lowered resistivity and formation a polysilicon layer to become a gate electrode, heat treatment for planarizing the interlayer insulating film, etc.

Further, in the described embodiments, although a case in which a horizontal silicon carbide MOSFET that uses a $p^+$-type semiconductor substrate is manufactured is described as an example, without limitation hereto, the same effects can be achieved in cases of application to a silicon carbide semiconductor device structured to have a high breakdown voltage such as a vertical silicon carbide MOSFET and the like that uses an $n^+$-type semiconductor substrate and the like, various types of semiconductor devices that have MOS gate, etc. Further, the described embodiments obtain the same effects when applied to a 4H—SiC substrate having a principal surface that is tilted 0 to 8 degrees from a 4H—SiC (11-20) surface. Further, the invention is similarly applicable when the conductivity types are reversed.

According to the disclosure above, in a process after gate insulating film formation, the atmosphere of heat treatment that is conventionally performed is set to be an inert gas atmosphere, whereby even in a case in which by thermal oxidation in an atmosphere that includes nitrogen, a gate insulating film is formed in a principal surface that is a surface of a silicon carbide semiconductor substrate, tilted about 0 to 8 degrees from a (000-1) surface or a (11-20) surface, a silicon carbide semiconductor device having a low interface state density of $4 \times 10^{11}$ $cm^{-2}$ $eV^{-1}$ or lower, and a flat band voltage of 1V or more can be manufactured without the addition of a new process.

The disclosed manufacturing method of a silicon carbide semiconductor device effects a normally OFF characteristic and enables the interface state density to be reduced.

As described, the disclosed manufacturing method of a silicon carbide semiconductor device is useful for semiconductor devices having a MOS gate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A manufacturing method of a silicon carbide semiconductor device, the manufacturing method comprising:
   forming a gate insulating film on a surface of a semiconductor substrate of silicon carbide, the surface being tilted within a range of 0 degrees or greater and 8 degrees or less from any one among a (000-1) surface and a (11-20) surface, the gate insulating film being formed by performing on the semiconductor substrate, a second heat treatment in an atmosphere that includes hydrogen, after a first heat treatment is performed in an oxidation atmosphere obtained from an oxidized compound that includes nitrogen; and
   performing a third heat treatment in an inert gas atmosphere and at a temperature lower than a temperature of the first heat treatment, all of the third heat treatment being performed after the forming of the gate insulating film.

2. The manufacturing method of the silicon carbide semiconductor device according to claim 1, wherein the first heat treatment is performed in an atmosphere that includes any one among nitrous oxide and nitric oxide.

3. The manufacturing method of the silicon carbide semiconductor device according to claim 1, wherein the forming of the gate insulating film includes oxidizing in a dry oxygen atmosphere before the first heat treatment, the surface of the semiconductor substrate, on which the gate insulating film is to be formed.

4. The manufacturing method of the silicon carbide semiconductor device according to claim 1, wherein the forming of the gate insulating film includes depositing before the first heat treatment, an insulating film that configures the gate insulating film and has a thickness that is thinner than a thickness of the gate insulating film.

5. The manufacturing method of the silicon carbide semiconductor device according to claim 1, wherein the inert gas atmosphere is an atmosphere that includes any one among nitrogen, helium, and argon.

6. A manufacturing method of a silicon carbide semiconductor device, comprising:
   providing a semiconductor substrate of silicon carbide, a surface of the semiconductor substrate being tilted within a range of 0 degrees or greater and 8 degrees or less from any one among a (000-1) surface and a (11-20) surface;
   forming a gate insulating film on the surface of a semiconductor substrate by subjecting the semiconductor substrate to a first heat treatment and a second heat treatment after the first heat treatment, the first heat treatment being performed in an oxidation atmosphere comprised of nitrogen oxide, the second heat treatment being performed in an atmosphere including hydrogen;

forming a gate electrode on the gate insulating film;
forming an interlayer insulating film that electrically insulates a metal film from the gate electrode;
forming the metal film on the surface of the semiconductor substrate;
subjecting the semiconductor substrate to a third heat treatment performed in an inert gas atmosphere, one of lowering a resistivity of the gate electrode and baking the interlayer insulating film being effected by the third heat treatment; and
subjecting the semiconductor substrate to a fourth heat treatment performed in an inert gas atmosphere so as to form an electrical contact between the semiconductor substrate and the metal film.

7. The manufacturing method of the silicon carbide semiconductor device according to claim 6, wherein a temperature of the third heat treatment and a temperature of the fourth heat treatment are lower than a temperature of the first heat treatment and a temperature of the second heat treatment.

* * * * *